US006969678B1

(12) United States Patent
Chiu et al.

(10) Patent No.: US 6,969,678 B1
(45) Date of Patent: Nov. 29, 2005

(54) MULTI-SILICIDE IN INTEGRATED CIRCUIT TECHNOLOGY

(75) Inventors: Robert J. Chiu, Santa Clara, CA (US); Paul R. Besser, Sunnyvale, CA (US); Simon Siu-Sing Chan, Saratoga, CA (US); Jeffrey P. Patton, Santa Clara, CA (US); Austin C. Frenkel, San Jose, CA (US); Thorsten Kammler, Ottendorft-Okrilla (DE); Errol Todd Ryan, Wappingers Fall, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/700,711

(22) Filed: Nov. 3, 2003

(51) Int. Cl.⁷ ............................................. H01L 21/44
(52) U.S. Cl. ...................... 438/655; 438/654; 438/683
(58) Field of Search ........................... 438/644, 649, 438/654, 655, 656, 290, 306, 682, 683

(56) References Cited

U.S. PATENT DOCUMENTS

| 5,646,070 A | * | 7/1997 | Chung | 438/644 |
| 6,468,900 B1 | * | 10/2002 | Bertrand et al. | 438/655 |
| 6,806,157 B2 | * | 10/2004 | Yang et al. | 438/306 |

* cited by examiner

Primary Examiner—Michael Lebentritt
Assistant Examiner—Walter L. Lindsay, Jr.
(74) Attorney, Agent, or Firm—Mikio Ishimaru

(57) ABSTRACT

A method of forming an integrated circuit, and an integrated circuit, are provided. A gate dielectric is formed on a semiconductor substrate, and a gate is formed over the gate dielectric. A sidewall spacer is formed around the gate and a source/drain junction is formed in the semiconductor substrate using the sidewall spacer. A bottom silicide metal is deposited on the source/drain junction and then a top silicide metal is deposited on the bottom silicide metal. The bottom and top silicide metals are formed into their silicides. A dielectric layer is deposited above the semiconductor substrate and a contact is formed in the dielectric layer to the top silicide.

8 Claims, 4 Drawing Sheets

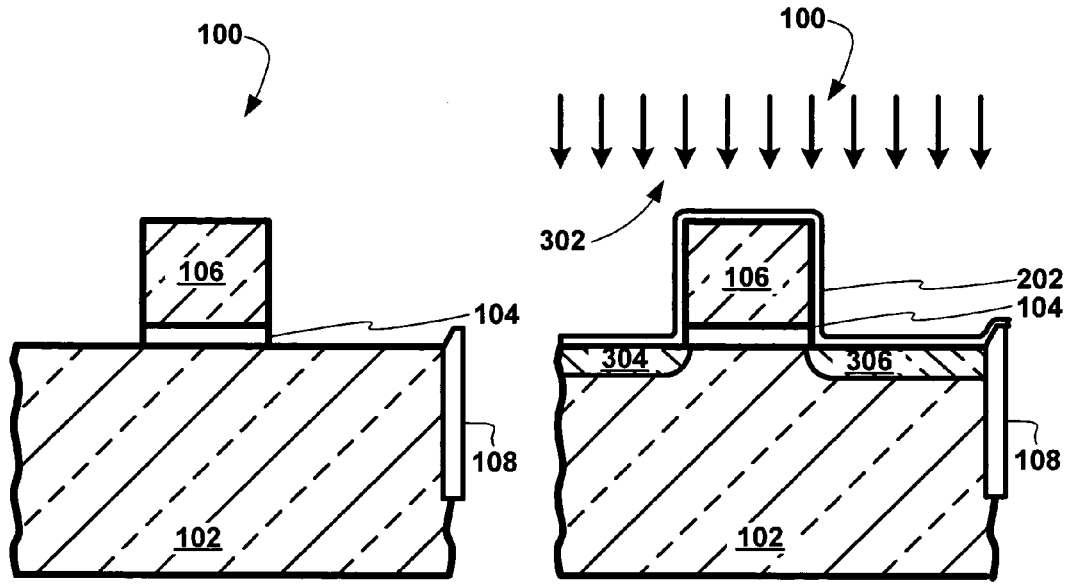
FIG. 1
FIG. 3
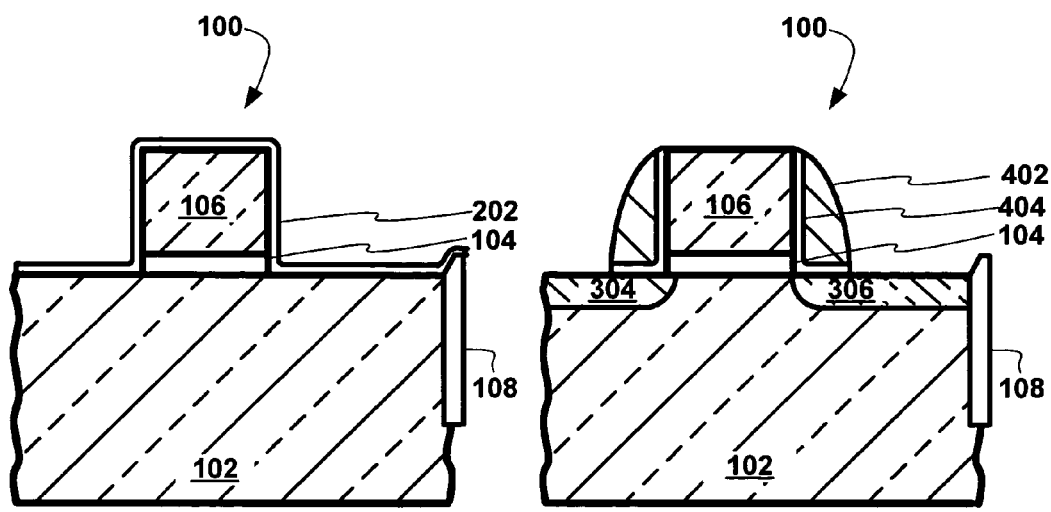
FIG. 2
FIG. 4

1000

```
┌─────────────────────────────────────────────┐
│   PROVIDING A SEMICONDUCTOR SUBSTRATE       │
│                  1002                        │
└─────────────────────────────────────────────┘
                      │
┌─────────────────────────────────────────────┐
│     FORMING A GATE DIELECTRIC ON THE        │
│        SEMICONDUCTOR SUBSTRATE              │
│                  1004                        │
└─────────────────────────────────────────────┘
                      │
┌─────────────────────────────────────────────┐
│     FORMING A GATE OVER THE GATE DIELECTRIC │
│                  1006                        │
└─────────────────────────────────────────────┘
                      │
┌─────────────────────────────────────────────┐
│   FORMING A SIDEWALL SPACER AROUND THE GATE │
│                  1008                        │
└─────────────────────────────────────────────┘
                      │
┌─────────────────────────────────────────────┐
│   FORMING A SOURCE/DRAIN JUNCTION IN THE    │
│ SEMICONDUCTOR SUBSTRATE USING THE SIDEWALL  │
│              SPACER   1010                   │
└─────────────────────────────────────────────┘
                      │
┌─────────────────────────────────────────────┐
│  FORMING A BOTTOM SILICIDE ON THE SOURCE/DRAIN │
│              JUNCTION   1012                 │
└─────────────────────────────────────────────┘
                      │
┌─────────────────────────────────────────────┐
│   FORMING A TOP SILICIDE ON THE BOTTOM SILICIDE │
│                  1014                        │
└─────────────────────────────────────────────┘
                      │
┌─────────────────────────────────────────────┐
│   DEPOSITING A DIELECTRIC LAYER ABOVE THE   │
│         SEMICONDUCTOR SUBSTRATE             │
│                  1016                        │
└─────────────────────────────────────────────┘
                      │
┌─────────────────────────────────────────────┐
│  FORMING A CONTACT IN THE DIELECTRIC LAYER TO │
│             THE TOP SILICIDE                 │
│                  1018                        │
└─────────────────────────────────────────────┘
```

FIG. 10

MULTI-SILICIDE IN INTEGRATED CIRCUIT TECHNOLOGY

BACKGROUND

1. Technical Field

The present invention relates generally to semiconductor technology, and more specifically to siliciding in semiconductor devices.

2. Background Art

Currently, electronic products are used in almost every aspect of life, and the heart of these electronic products is the integrated circuit. Integrated circuits are used in everything from CD players and cameras to microwaves.

Integrated circuits are made in and on silicon wafers by extremely complex systems that require the coordination of hundreds or even thousands of precisely controlled processes to produce a finished semiconductor wafer. Each finished semiconductor wafer has hundreds to tens of thousands of integrated circuits, each worth hundreds or thousands of dollars.

Integrated circuits are made up of hundreds to millions of individual components. One common component is the semiconductor integrated circuit. The most common and important semiconductor technology presently used is silicon-based, and the most preferred silicon-based semiconductor device is a Complementary Metal Oxide Semiconductor (CMOS) integrated circuit.

The principal elements of a CMOS integrated circuit generally consist of a silicon substrate having shallow trench oxide isolation regions cordoning off integrated circuit areas. The integrated circuit areas contain polysilicon gates on silicon oxide gates, or gate oxides, over the silicon substrate. The silicon substrate on both sides of the polysilicon gate is slightly doped to become conductive. The lightly doped regions of the silicon substrate are referred to as "shallow source/drain junctions", which are separated by a channel region beneath the polysilicon gate. A curved silicon oxide or silicon nitride spacer, referred to as a "sidewall spacer", on the sides of the polysilicon gate allows deposition of additional doping to form more heavily doped regions of the shallow source/drain junctions, which are called "deep source/drain junctions". The shallow and deep source/drain junctions are collectively referred to as "source/drain junctions".

To complete the integrated circuit, a silicon oxide dielectric layer is deposited to cover the polysilicon gate, the curved sidewall spacer, and the silicon substrate. To provide electrical connections for the integrated circuit, openings are etched in the silicon oxide dielectric layer to the polysilicon gate and the source/drain junctions. The openings are filled with metal to form electrical contacts. To complete the integrated circuits, the contacts are connected to additional levels of wiring in additional levels of dielectric material to the outside of the dielectric material.

In operation, an input signal to the gate contact to the polysilicon gate controls the flow of electric current from one source/drain contact through one source/drain junction through the channel to the other source/drain junction and to the other source/drain contact.

Integrated circuits are fabricated by thermally growing a gate oxide layer on the silicon substrate of a semiconductor wafer and forming a polysilicon layer over the gate oxide layer. The oxide layer and polysilicon layer are patterned and etched to form the gate oxides and polysilicon gates, respectively. The gate oxides and polysilicon gates in turn are covered by an oxide liner and are used as masks to form the shallow source/drain regions by ion implantation of boron or phosphorus impurity atoms into the surface of the silicon substrate. The ion implantation is followed by a high-temperature anneal above 700° C. to activate the implanted impurity atoms to form the shallow source/drain junctions.

A silicon nitride layer is deposited and etched to form sidewall spacers around the side surfaces of the gate oxides and polysilicon gates. The sidewall spacers, the gate oxides, and the polysilicon gates are used as masks for the conventional source/drain regions by ion implantation of boron or phosphorus impurity atoms into the surface of the silicon substrate into and through the shallow source/drain junctions. The ion implantation is again followed by a high-temperature anneal above 700° C. to activate the implanted impurity atoms to form the source/drain junctions.

After formation of the integrated circuits, a silicon oxide dielectric layer is deposited over the integrated circuits and contact openings are etched down to the source/drain junctions and to the polysilicon gates. The contact openings are then filled with a conductive metal and interconnected by formation of conductive wires in other interlayer dielectric (ILD) layers.

As integrated circuits have decreased in size, it has been found that the electrical resistance between the metal contacts and the silicon substrate or the polysilicon has increased to the level where it negatively impacts the performance of the integrated circuits. To lower the electrical resistance, a transition material is formed between the metal contacts and the silicon substrate or the polysilicon. The best transition materials have been found to be cobalt silicide ($CoSi_2$) and titanium silicide ($TiSi_2$).

The silicides are formed by first applying a thin layer of the cobalt or titanium on the silicon substrate above the source/drain junctions and the polysilicon gates. The semiconductor wafer is subjected to one or more annealing steps at temperatures above 800° C. and this causes the cobalt or titanium to selectively react with the silicon and the polysilicon to form the metal silicide. The process is generally referred to as "siliciding". Since the shallow trench oxide and the sidewall spacers will not react to form a silicide, the silicides are aligned over the source/drain junctions and the polysilicon gates so the process is also referred to as "self-aligned siliciding", or "saliciding".

However, existing siliciding and saliciding have not succeeded in solving all the problems related to connecting metal contacts to silicon.

The problems include, but are not limited to, gate-to-source/drain junction short-circuits.

Solutions to these problems have been long sought but prior developments have not taught or suggested any solutions and, thus, solutions to these problems have long eluded those skilled in the art.

DISCLOSURE OF THE INVENTION

The present invention provides a method of forming an integrated circuit, and an integrated circuit. A gate dielectric is formed on a semiconductor substrate, and a gate is formed over the gate dielectric. A sidewall spacer is formed around the gate and a source/drain junction is formed in the semiconductor substrate using the sidewall spacer. A bottom silicide metal is deposited on the source/drain junction and then a top silicide metal is deposited on the bottom silicide metal. The bottom and top silicide metals are formed into their silicides. A dielectric layer is deposited above the semiconductor substrate and a contact is formed in the dielectric layer to the top silicide. This solves the problem of gate-to-source/drain junction short-circuits.

Certain embodiments of the invention have other advantages in addition to or in place of those mentioned above. The advantages will become apparent to those skilled in the art from a reading of the following detailed description when taken with reference to the accompanying drawings.

BRIEF DESCRIPTION OF THE DRAWINGS

FIG. 1 is a view of an integrated circuit in an intermediate stage of fabrication in accordance with the present invention;

FIG. 2 is the structure of FIG. 1 with a liner layer deposited thereon;

FIG. 3 is the structure of FIG. 2 during ion implantation to form shallow source/drain junctions;

FIG. 4 is the structure of FIG. 3 after formation of a sidewall spacer;

FIG. 10 is a simplified flow chart of the method of manufacturing the integrated circuit in accordance with the present invention.

DETAILED DESCRIPTION OF THE INVENTION

Figure 5:
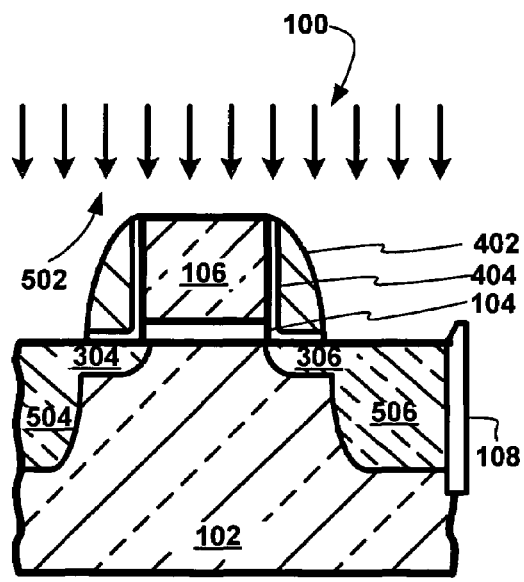
FIG. 5 is the structure of FIG. 4 during ion implantation to form deep source/drain junctions.

In the following description, numerous specific details are given to provide a thorough understanding of the invention. However, it will be apparent to one skilled in the art that the invention may be practiced without these specific details. In order to avoid obscuring the present invention, some well-known configurations and process steps are not disclosed in detail. In addition, the drawings showing embodiments of the apparatus are semi-diagrammatic and not to scale and, particularly, some of the dimensions are for the clarity of presentation and may be exaggerated in the drawing FIGs. The same numbers will be used in all the drawing FIGs. to relate to the same elements.

The term "horizontal" as used herein is defined as a plane parallel to a substrate or wafer. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

Referring now to FIG. 1, therein is shown an integrated circuit 100 in an intermediate stage of fabrication in accordance with the present invention.

To form the intermediate stage, a gate dielectric layer, such as silicon oxide, has been deposited on a semiconductor substrate 102 of a material such as silicon and a conductive gate layer, such as polysilicon, has been deposited over the gate dielectric layer. The layers are patterned and etched to form a gate dielectric 104 and a gate 106. The semiconductor substrate 102 has been further patterned, etched, and filled with a silicon oxide material to form a shallow trench isolation represented by a STI 108.

Referring now to FIG. 2, therein is shown the structure of FIG. 1 having a liner 202 deposited thereon. The liner 202, generally of silicon oxide, covers the semiconductor substrate 102, the gate dielectric 104, the gate 106, and the STI 108. The liner 202 can be of an etch stop material or an implant-protection material.

Referring now to FIG. 3, therein is shown the structure of FIG. 2 during an ion implantation 302 to form shallow source/drain junctions 304 and 306.

The gate 106 and the gate dielectric 104 act as masks for the formation of shallow source/drain junctions 304 and 306 by the ion implantation 302 of boron or phosphorus impurity atoms into the surface of the semiconductor substrate 102. The ion implantation 302 is followed by a high-temperature anneal above 700° C. to activate the implanted impurity atoms to form the shallow source/drain junctions 304 and 306.

Referring now to FIG. 4, therein is shown the structure of FIG. 3 after formation of a sidewall spacer 402 and a shallow source/drain liner 404.

A sidewall spacer layer, generally of silicon nitride, has been deposited and etched to form the curved shape of the sidewall spacer 402. The etching of the sidewall spacer 402 also etches the liner 202 of FIG. 2 and leaves the liner 202 over the shallow source/drain region to form the shallow source/drain liner 404.

Referring now to FIG. 5, therein is shown the structure of FIG. 4 during an ion implantation 502 to form deep source/drain junctions 504 and 506.

The sidewall spacer 402, the gate 106, and the STI 108, act as masks for the formation of the deep source/drain regions by the ion implantation 502 of boron or phosphorus impurity atoms into the surface of the semiconductor substrate 102 and into and through the shallow source/drain junctions 304 and 306, respectively. The ion implantation 502 is again followed by a high-temperature anneal above 700° C. to activate the implanted impurity atoms to form the deep source/drain junctions 504 and 506.

Figure 6:
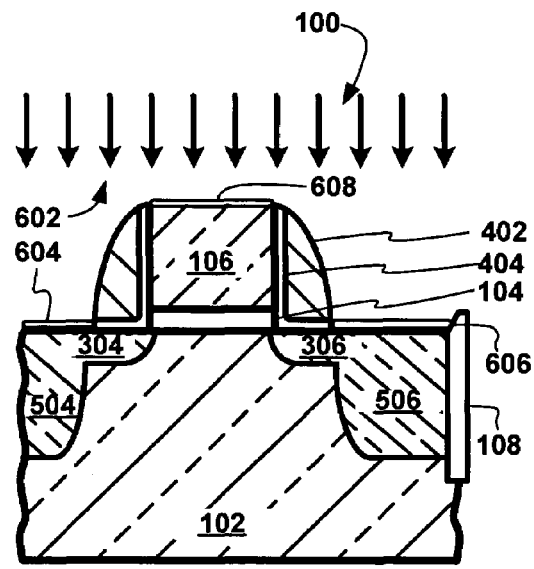
FIG. 6 is the structure of FIG. 5 during the deposition of a bottom silicide metal.

Referring now to FIG. 6, therein is shown a deposition process 602 used in the formation of a layer of a bottom silicide.

Generally, there are three general ways in which to form a silicide. In one technique, the deposition process 602 deposits a pure metal on exposed silicon areas (both single crystalline and polycrystalline silicon). Thereafter, the metal is reacted with the silicon to form what is known as a first phase, metal-rich silicide. The non-reacted metal is then removed, and the pre-existing first phase product is then reacted again with the underlying silicon to form a second phase, silicon-rich silicide. In a second technique, the deposition process 602 involves co-evaporation of both metal and silicon onto the exposed silicon. Both metal and silicon are vaporized by, for example, an electron beam. The vapor is then drawn onto the wafer and across the silicon. In a third technique, the deposition process 602 involves co-sputtering both metal and silicon onto the silicon surface. Co-sputtering entails physically dislodging metal and silicon materials from a composite target or separate targets, and then directing the composite material onto the wafer.

Conventional salicidation processes have become problematic with modern semiconductor devices that have shallow source/drain junctions, e.g., junction depths on the order of 1000 Angstroms (Å). In particular, during such salicidation processes, some of the existing source/drain regions are consumed.

When cobalt is used as the refractory metal, it consumes about twice its thickness of silicon in the process of being converted to a metal silicide, e.g., a 100 Å layer of cobalt consumes about 103 Å of silicon. Such consumption acts to reduce the dopant present in the source/drain junctions and may adversely impact the electrical performance characteristics of the source/drain junctions, and ultimately, degrades the performance of the integrated circuit.

When the refractory metal is titanium, titanium silicide forms between metal contacts because the sidewall spacer becomes smaller with smaller integrated circuits thereby allowing a capacitive-coupled or fully conductive path between the polysilicon gate and the source/drain junctions, and similarly, degrades the performance of the integrated circuit.

While the present invention may be used with various metal silicides, it has been found that nickel silicide has many desirable characteristics. However, it has also been found that nickel silicide is subject to gate-to-source/drain short circuits. It has been discovered that the short circuits are due to diffusion of the nickel silicide under the shallow source/drain liners 404 from over the deep source/drain junctions 504 and 506 along the surface of the semiconductor substrate 102 to the gate dielectric 104.

It has been discovered that by preventing nickel silicide from reaching the semiconductor substrate 102, it is possible to eliminate the short-circuiting problem by preventing the nickel silicide from diffusing to the gate 106.

It has further been discovered that a good material to prevent silicide diffusion is unexpectedly the cobalt silicide, which was previously considered undesirable.

By depositing cobalt as a bottom silicide metal in a thickness under about 10 Å on the semiconductor substrate 102 and then depositing nickel as a top silicide metal in a thickness of about 80 Å to 100 Å on the cobalt, the annealing for salicidation forms a dual silicide of cobalt silicide that blocks diffusion of nickel silicide.

In one embodiment shown in FIG. 6, the process 602 deposits a silicide metal, which is referred to as bottom silicide metals 604, 606, and 608 in accordance with the present invention. The bottom silicide metals 604 and 606 are formed on the silicon of the semiconductor substrate 102 over the deep source/drain junctions 504 and 506, respectively, and the bottom silicide metal 608 is formed on the polysilicon of the gate 106.

Figure 7:
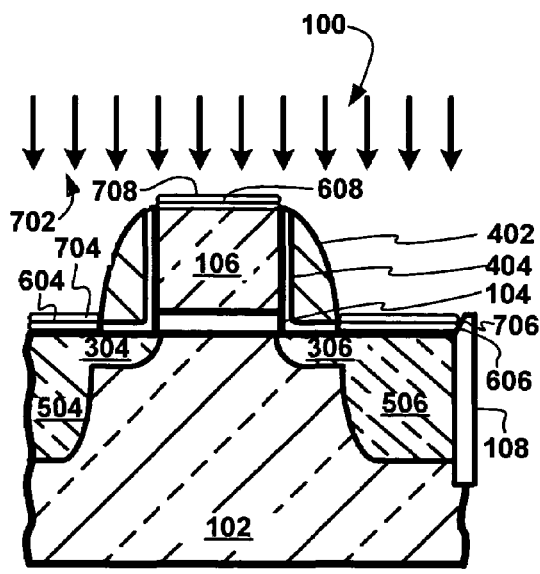
FIG. 7 is the structure of FIG. 6 during the deposition of a top silicide metal.

Referring now to FIG. 7, therein is shown a deposition process 702 in accordance with the present invention. The process 702 deposits a silicide metal, which is referred to as top silicide metals 704, 706, and 708 in accordance with the present invention. The top silicide metals 704 and 706 are formed on the bottom silicide metals 604 and 606, and the top silicide metal 708 is formed on the bottom silicide metal 608.

Figure 8:
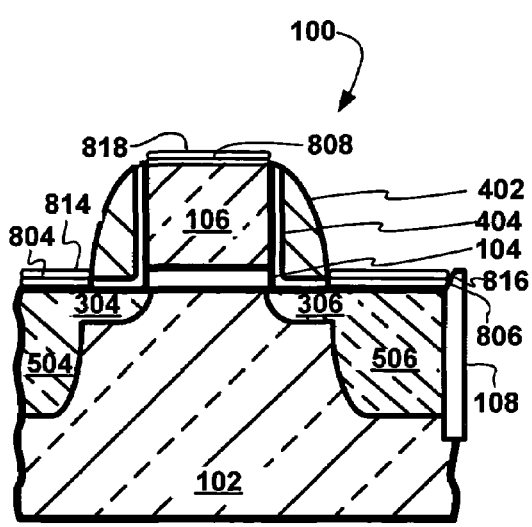
FIG. 8 is the structure of FIG. 7 after annealing to form bottom and top silicides.

Referring now to FIG. 8, therein is shown the structure of FIG. 7 after anneal. The bottom silicide metals 604, 606, and 608 combine with silicon to form bottom silicides 804, 806, and 808, respectively. The top silicide metals 704 and 706 are formed with the silicon of the semiconductor substrate 102 diffusing through the bottom silicides 804 and 806 over the deep source/drain junctions 504 and 506, respectively, to form top silicides 814 and 816. The top silicide metal 708 combines with the polysilicon diffusing through the top silicide 808 from the gate 106 to form top silicide 818.

Additional layers of silicide in further multi-silicide structures may be deposited to obtain other advantageous effects. In the one preferred embodiment above, the bottom silicide is cobalt silicide and the top silicide is nickel silicide. With cobalt and nickel, the salicidation process is performed at the low nickel siliciding temperature of about 360° and the rapid nickel siliciding time of about 30 seconds.

Figure 9:
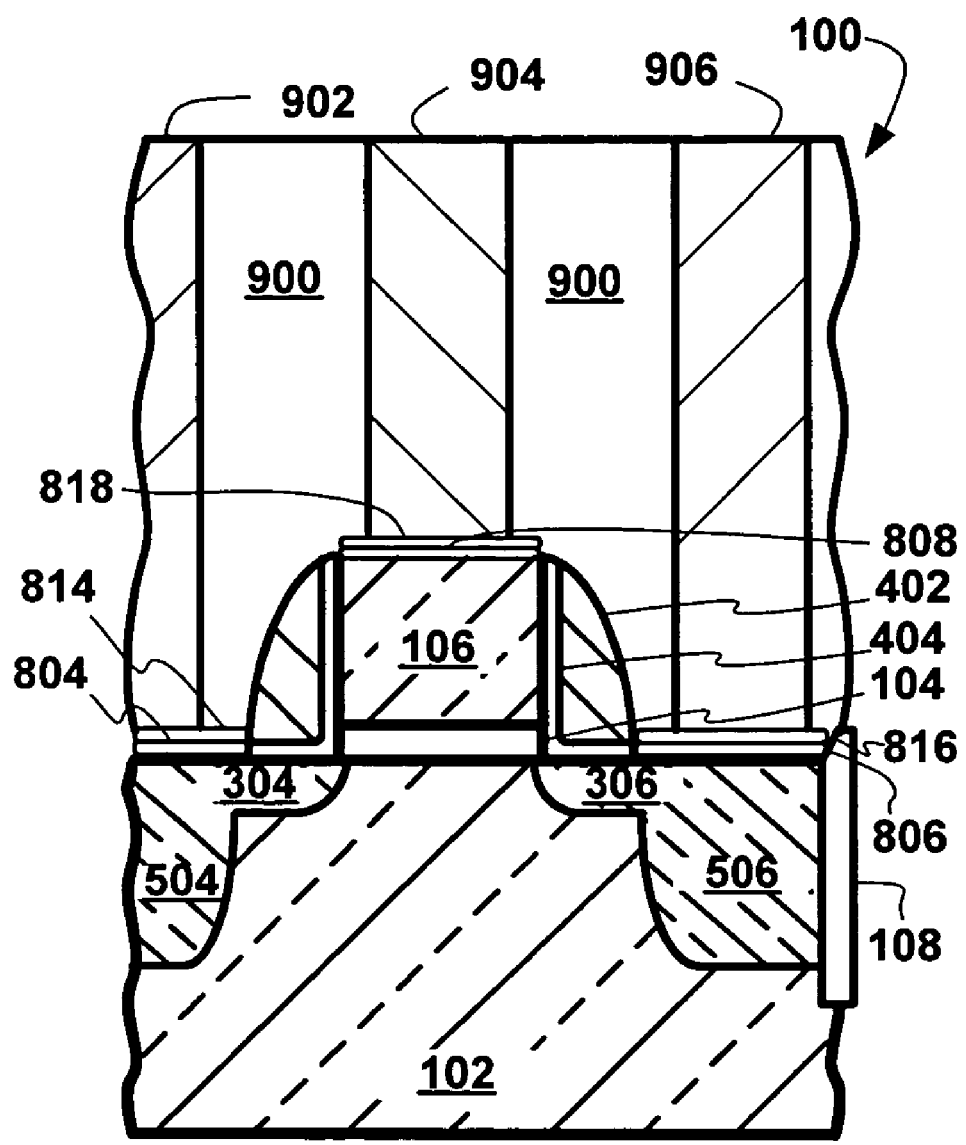
FIG. 9 is the structure of FIG. 8 after deposition of a dielectric layer and formation of metal contacts.

Referring now to FIG. 9, therein is shown the structure of FIG. 8 after deposition of a dielectric layer 900 over the top silicides 814, 816, and 818, the sidewall spacer 402, and the STI 108.

In various embodiments, the dielectric layer 902 is of dielectric materials such as silicon oxide ($SiO_x$), tetraethylorthosilicate (TEOS), borophosphosilicate (BPSG) glass, etc. with dielectric constants from 4.2 to 3.9 or low dielectric constant dielectric materials such as fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilil borxle (SOB), diaceloxyditerliarybutosiloxane (DADBS), trimethylsilil phosphate (SOP), etc. with dielectric constants below 3.9 to 2.5. Ultra-low dielectric constant dielectric materials, having dielectric constants below 2.5 and which are available, include commercially available Teflon-AF, Teflon microemulsion, polimide nanofoams, silica aerogels, silica xerogels, and mesoporous silica. Stop layers and capping layers (where used) are of materials such as silicon nitride ($Si_xN_x$) or silicon oxynitride (SiON).

Also, shown are metal contacts 902, 904, and 906, which are formed in the dielectric layer 900. The metal contacts 902, 904, and 906 are respectively electrically connected to the top silicides 814, 818, and 816, and respectively to the deep source/drain junction 504, the gate 106, and the deep source/drain junction 506.

In various embodiments, the metal contacts 902, 904, and 906 are of metals such as tantalum (Ta), titanium (Ti), tungsten (W), alloys thereof, and compounds thereof. In other embodiments, the metal contacts 902, 904, and 906 are of metals such as copper (Cu), gold (Au), silver (Ag), alloys thereof, and compounds thereof with one or more of the above elements with diffusion barriers around them.

Referring now to FIG. 10, therein is shown a simplified flow chart of a method 1000 for manufacturing the integrated circuit 100 in accordance with the present invention. The method 1000 includes: providing a semiconductor substrate in a step 1002; forming a gate dielectric on the semiconductor substrate in a step 1004; forming a gate over the gate dielectric in a step 1006; forming a sidewall spacer around the gate in a step 1008; forming a source/drain junction in the semiconductor substrate using the sidewall spacer in a step 1010; forming a bottom silicide metal on the source/drain junction in a step 1012; forming a top silicide on the bottom silicide in a step 1014; depositing a dielectric layer above the semiconductor substrate in a step 1016; and forming a contact in the dielectric layer to the top silicide in a step 1018.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hithertofore set forth or shown in the accompanying drawings are to be interpreted in an illustrative and non-limiting sense.

The invention claimed is:

1. A method of forming an integrated circuit comprising:
   providing a semiconductor substrate;
   forming a gate dielectric on the semiconductor substrate;
   forming a gate over the gate dielectric;
   forming a sidewall spacer around the gate;

forming a source/drain junction in the semiconductor substrate using the sidewall spacer;

forming a bottom silicide over the source/drain junction, the bottom silicide of cobalt silicide using cobalt of a thickness under 10 Angstroms;

forming a top silicide over the bottom silicide, the top silicide of nickel silicide using nickel of a thickness under 100 Angstroms, forming the nickel forms a thicker layer of the nickel than the cobalt;

forming a dielectric layer above the semiconductor substrate; and forming a contact in the dielectric layer to the top silicide.

2. The method as claimed in claim 1 wherein:

forming the bottom silicide forms a silicide having slower diffusion characteristics than the top silicide.

3. The method as claimed in claim 1 wherein:

forming the bottom silicide uses a bottom silicide metal;

forming the top silicide uses a top silicide metal which is different from the bottom silicide metal; and simultaneously annealing the bottom and top silicide metals to form the bottom and top silicides simultaneously.

4. The method as claimed in claim 1 wherein:

forming the bottom silicide and forming the top silicide include annealing at a siliciding temperature and time of the top silicide.

5. The method as claimed in claim 1 wherein:

forming the bottom silicide and forming the top silicide forms the top silicide in contact with the bottom silicide.

6. A method of forming an integrated circuit comprising:

providing a semiconductor substrate;

forming a gate dielectric on the semiconductor substrate;

forming a gate over the gate dielectric;

forming a shallow source/drain junction in the semiconductor substrate using the gate;

forming a sidewall spacer around the gate;

forming a deep source/drain junction in the semiconductor substrate using the sidewall spacer;

forming a cobalt silicide over the deep source/drain junction, forming the cobalt silicide uses cobalt of a thickness under 10 Angstroms;

forming a nickel silicide over the cobalt silicide, forming the nickel silicide uses nickel, forming the nickel forms a thicker layer of the nickel than the cobalt, and forming the nickel silicide uses nickel of a thickness under 100 Angstroms;

forming a dielectric layer above the semiconductor substrate; and forming a contact in the dielectric layer to the nickel silicide.

7. The method as claimed in claim 6 wherein:

forming the cobalt silicide forms a silicide having slower diffusion characteristics than the nickel silicide.

8. The method as claimed in claim 6 wherein:

forming the cobalt silicide and forming the nickel silicide forms the nickel silicide in contact with the cobalt silicide.

* * * * *